United States Patent

Shimura

Patent Number: 5,751,738
Date of Patent: May 12, 1998

[54] PATTERN GENERATOR CICUIT FOR SEMICONDUCTOR TEST SYSTERM

[75] Inventor: Michio Shimura, Hanyu, Japan

[73] Assignee: Advantest Corp., Tokyo, Japan

[21] Appl. No.: 677,016

[22] Filed: Jul. 8, 1996

[30] Foreign Application Priority Data

Jul. 11, 1995 [JP] Japan .................... 7-198135

[51] Int. Cl.⁶ ............................. G06F 11/00
[52] U.S. Cl. ................................ 371/27.7
[58] Field of Search ............... 371/27.7, 27.1, 371/27.5, 27.6, 28; 395/182.01

[56] References Cited

U.S. PATENT DOCUMENTS 5,602,999  2/1997  Hyatt ............................. 395/401
5,613,077  3/1997  Leung et al. ............... 395/182.01

*Primary Examiner*—Vincent P. Canney
*Attorney, Agent, or Firm*—Muramatsu & Associates

[57] ABSTRACT

A pattern generator that makes it possible to use various option pattern generators (PGs) without changing hardware is realized. To accomplish this, an option circuit includes an option PG initial clock control section that generates an initial clock signal in synchronism with a clock signal to initialize the option PGs; a plurality of option PGs selectively receive one of a plurality of clock output signals of a clock output control section and generate pattern and clock signals; and in a multiplexer which selects one of output signals from the plurality of PGs through an instruction from a select register 24, and a FIFO section which receives a signal from the multiplexer as write data and a write clock, and an output signal of a read clock control section as a read clock, and outputs a signal to a logic circuit as the option PG output signal.

5 Claims, 5 Drawing Sheets

PATTERN GENERATOR CICUIT FOR SEMICONDUCTOR TEST SYSTERM

FIELD OF THE INVENTION

The present invention relates to a pattern generator circuit that makes it possible to add various option pattern generators to the pattern generators of semiconductor test equipment without changing the hardware.

BACKGROUND OF THE INVENTION

FIG. 4 shows a conventional pattern generator circuit with an added option pattern generator. The main sections that make up this circuit are as follows: clock generator 50, which generates CLK1, CLK2, and CLK3; main PG (pattern generator) 10 (made up of $n_1$ pipeline stages), which is clocked by CLK1; register 11, into which the output of main PG 10 is clocked by CLK2; delay circuit A (12), which delays the output signal from register 11; logic circuit 13, which ORs the output of delay circuit A (12) with the output of the option PG; and register 14, which has the output of logic circuit 13 clocked into it by CLK3, and generates the PAT (pattern) signal.

The option circuit is made up of option PG-A 51 (made up of $n_2$ pipeline stages), which is clocked by CLK1; shift register 52, which adds $(n_1-n_2)$ pipeline stages to the end of PG-A 51; shift register 53, into which the output of register 52 is clocked by CLK2; delay circuit E (54), which delays the output signal coming from register 53; option PG-B (55), clocked by CLK2, which is configured to provide delayed operation with no pipeline; and multiplexer 56, which selects the output of either delay circuit E (54), or option PG-B (55), depending on the state of a select signal received from select register 57, and outputs it to logic circuit 13 as the option PG output.

FIG. 5 is an example of a timing diagram for a conventional pattern generator.

In this conventional pattern generator, main PG 10 has $n_1$ pipeline stages. Therefore, the first pattern does not appear in its output until $(n_1+1)$ clocks have been input. Consequently, if an option PG-A having $n_2$ pipeline stages (where $n_2$ is less than $n_1$) is connected; then in order to use the same CLK1 to operate both PGs, $(n_1-n_2)$ additional pipeline stages must be added to option PG-A. In addition, in order to connect an option PG-B (55) configured for delayed operation with no pipeline, both the main PG and option PG-A must be delayed by an amount equal to d, the delay introduced by PG-B.

The following problems are created by configuring the total circuit in this manner, such that the number of pipeline stages and the amount of delay are hardware-dependent:

1) Circuit designers have very little freedom in the design of the option PG, and the circuits are therefore limited.

2) The entire PG must be redesigned to add a new option PG.

The object of the present invention is to provide a pattern generator in which it is possible to use a variety of option PGs without making hardware changes.

SUMMARY OF THE INVENTION

The pattern generator of the present invention is constituted as follows:

In a pattern generator, a main portion of which comprises a clock generator 20 which generates CLK1, CLK2, and CLK3; a main PG (pattern generator) 10 (made up of $n_1$ pipeline stages), which is clocked by CLK1; a register 11, into which the output of main PG 10 is clocked by CLK2; a delay circuit A (12), which delays the output signal from register 11; a logic circuit 13, which ORs the output of a delay circuit A (12) with the output of an option PG; and a register 14, which has the output of logic circuit 13 clocked into it by CLK3, and which generates the PAT (pattern) signal; is an option circuit that comprises an option PG initial clock control section 21 that generates an initial clock signal (INITCLK) synchronous with a CLK4 from clock generator 20, and initializes various option PGs and a FIFO (first in first out) section 31; an option PG clock control section 22 that inputs an enable signal that was generated by main PG 10 and delayed by a delay circuit B (33), and generates a clock output signal synchronous with CLK2; a read clock (RCLK) control section 23 that inputs an enable signal that is generated from main PG 10 and delayed by delay circuit B (33) and delay circuit C (34), and generates a clock output signal that is synchronous with a CLK5 output from clock generator circuit 20 synchronous with CLK3; a clock output control section 26, which inputs the result obtained by taking, in logic circuit 25, the logical OR of the clock output signal of option PG clock control section 22 and the INITCLK signal of option PG initial clock control section 21, and selects, through the operation of select register 24, one output of a plurality of clock outputs, for its output; a plurality of option PGs 27, 28, and 29, each of which inputs one of a plurality of clock output signals output by clock output control section 26, and outputs pattern data and clock signals; and a FIFO section 31, which, through the operation of select register 24, selects, in multiplexer 30, the output signals of one of a plurality of option PGs as its write data (WDT) and write clock (WCLK) inputs, and also inputs as RCLK (read clock), the signal obtained by ORing, in logic circuit 32, the INITCLK output signal of option PG initial clock control section 21, after it has been delayed by delay circuit 35, with the output of RCLK control section, and outputs a signal to logic circuit 13 as the option PG output signal.

In addition, as shown in FIG. 2, option PG initial clock control section 21 comprises an initial clock register 41 that can be set to the desired number of pipeline stages to initialize the option PG; a clock division ratio register 42 that sets the clock division ratio of a clock (CLK4) such as to set the initial clock (INITCLK) frequency to an operating frequency at which it is possible to operate the option PG; a clock divider circuit 43 that, with CLK4 as its input, generates a divided clock output in accordance with the setting of clock division ratio register 42; a counter 44, which has the contents of initial clock register 41 loaded into it by the LOADCMD signal, and is counted by the divided clock signal, which is the output of clock divider circuit 43; and a counter ≠0 detector circuit 45, which detects the fact that the output of counter 44 has become "0", to control the output of the divided clock signal, which is the output of clock divider circuit 43, as the INITCLK signal.

In a pattern generator constituted as described above, an option PG and FIFO 31 can be initialized to have the desired number of pipeline stages by an INITCLK signal generated by option PG initial clock control section 21.

In addition, for an option PG with no pipeline, operating in delayed operation, within a range determined by delay time d, the delay time can be absorbed by FIFO section 31.

In addition, within a range determined by p1, where p1 is the number of patterns generated by main PG 10, the number of patterns generated by the option PG can be controlled by the enable signal generated by main PG 10.

DETAILED DESCRIPTION OF THE INVENTION

Figure 1:
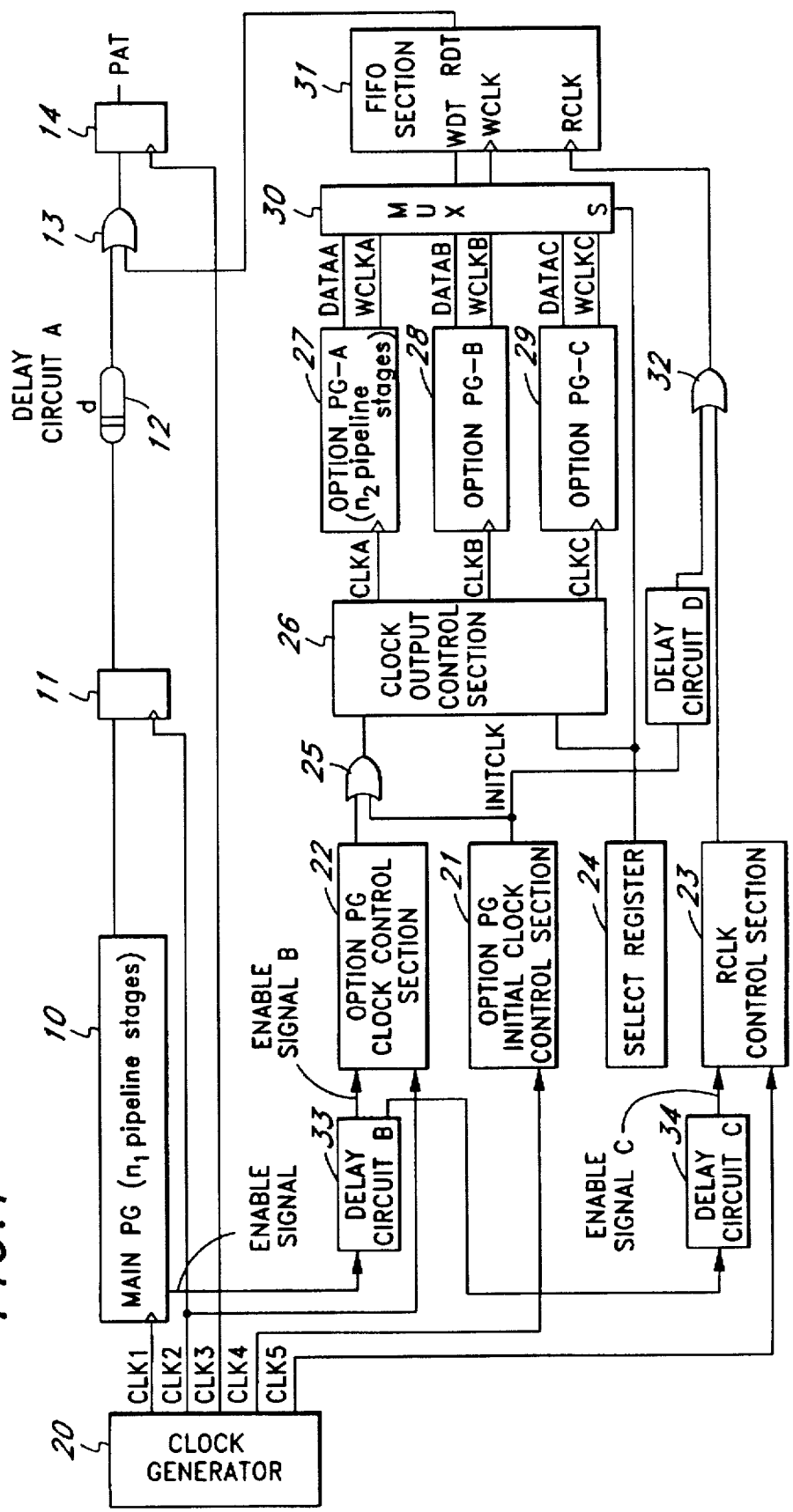
FIG. 1 is a block diagram of the pattern generator of the present invention.

FIG. 1 is a block diagram of the pattern generator of the present invention. For this circuit, in a main section comprising a clock generator 20, which generates a first clock (CLK1), second clock (CLK2), and a third clock (CLK3); a main PG 10 (made up of $n_1$ pipeline stages), which is clocked by CLK1; a register 11, into which the output of main PG 10 is clocked by CLK2; a delay circuit A (12), which delays the output signal of register 11; a logic circuit 13, which ORs the output of a delay circuit A (12) with the output of an option PG; and a register 14, which has the output of logic circuit 13 clocked into it by CLK3, and generates the PAT (pattern) signal; is an option circuit comprising an option PG initial clock control section 21 that generates an initial clock signal (INITCLK) that is synchronous with a fourth clock (CLK4) from clock generator 20 and initializes various option PGs and a FIFO (first in first out) section 31; an option PG clock control section 22 that inputs an enable signal that was generated by main PG 10 and delayed by a delay circuit B (33), and generates a clock output signal that is synchronous with CLK2; a read clock (RCLK) control section 23 that inputs an enable signal that is generated from main PG 10 and delayed by delay circuit B (33) and delay circuit C (34), and generates a clock output signal that is synchronous with a fifth clock (CLK5) output from clock generator circuit 20 synchronous with CLK3; a clock output control section 26, which inputs the result obtained by taking, in logic circuit 25, the logical OR of the clock output signal of option PG clock control section 22 and the INITCLK signal of option PG initial clock control section 21, and selects, through the operation of select register 24, one output of a plurality of clock outputs, for its output; a plurality of option PGs 27, 28, and 29, each of which inputs one of a plurality of clock output signals output by clock output control section 26, and outputs pattern data and clock signals; and a FIFO section 31, which, through the operation of select register 24, selects, in multiplexer 30, the output signals of one of a plurality of option PGs as its write data (WDT) and write clock (WCLK) inputs, and also inputs as RCLK (read clock), the signal obtained by ORing, in logic circuit 32, the INITCLK output signal of option PG initial clock control section 21 after it has been delayed by delay circuit 35, with the output of the RCLK control section 23, and outputs a signal to logic circuit 13, as the option PG output signal.

Figure 2:
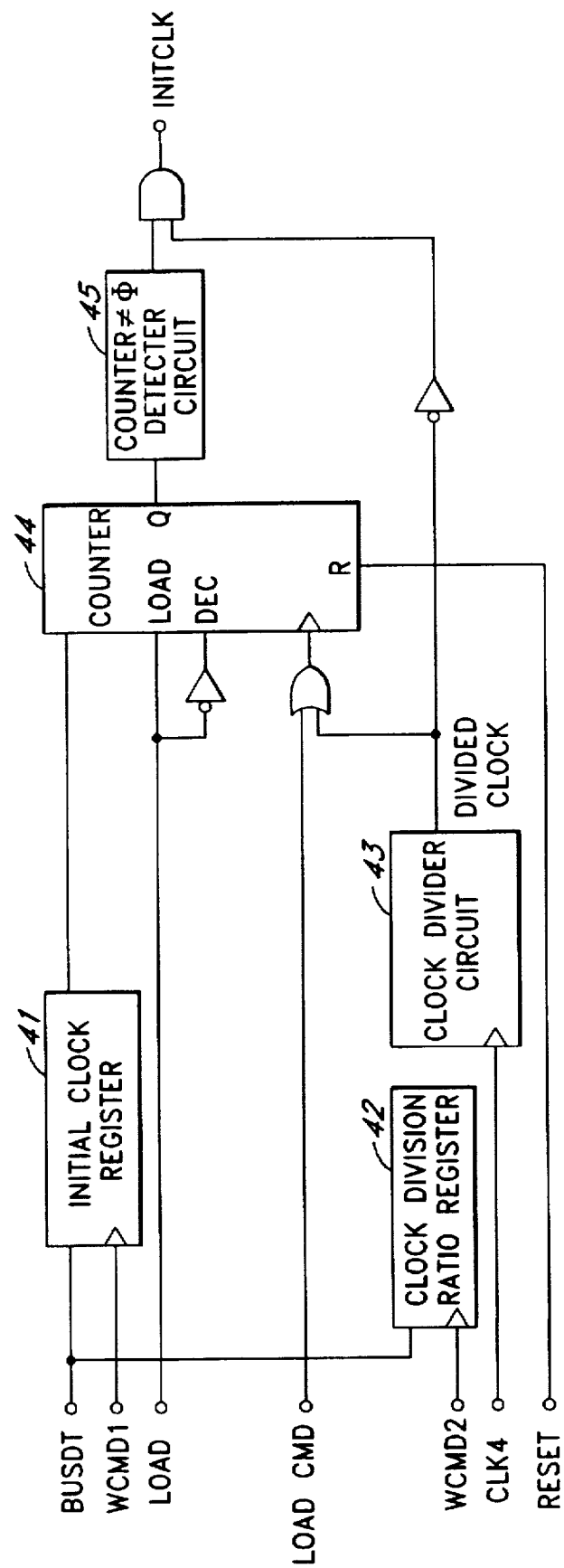
FIG. 2 is a block diagram of the option PG initial clock control section of the present invention.

In addition, as shown in FIG. 2, option PG initial clock control section 21 comprises an initial clock register 41 that can be set to the desired number of pipeline stages to initialize the option PG; a clock division ratio register 42 that sets the clock division ratio of the clock (CLK4) in order to set the initial clock (INITCLK) frequency to an operating frequency at which it is possible to operate the option PG; a clock divider circuit 43 that, with CLK4 as its input, generates a divided clock output in accordance with the setting of clock division ratio register 42; a counter 44, which has the contents of initial clock register 41 loaded into it by the LOADCMD signal, and is counted by the divided clock signal, which is the output of clock divider circuit 43; and a counter ≠0 detector circuit 45, which detects the fact that the output of counter 44 has become "0," to control the output of the divided clock signal, which is the output of clock divider circuit 43, as the INITCLK signal.

Figure 3:
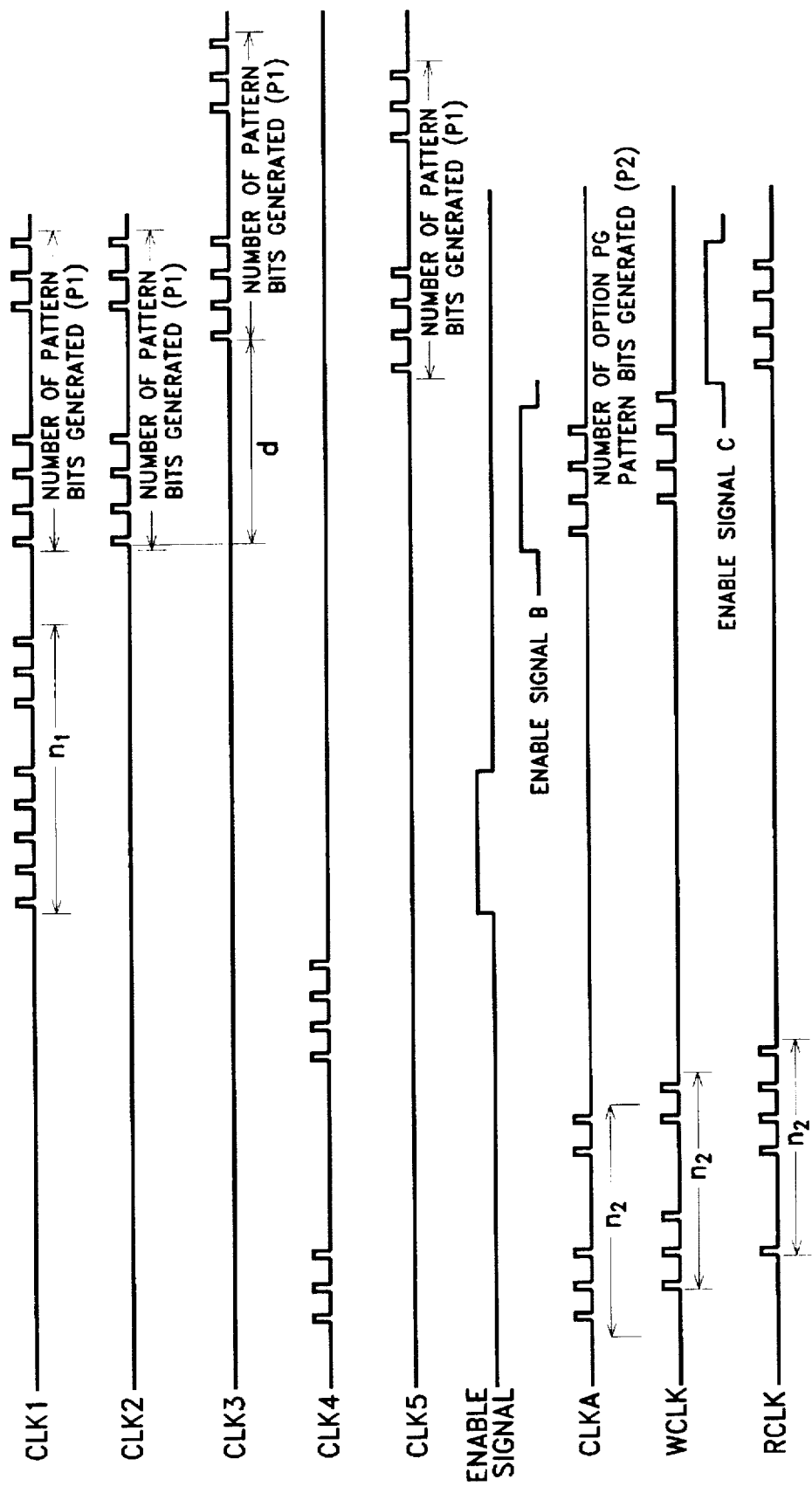
FIG. 3 is an example of a timing diagram for the present invention.
Figure 4:
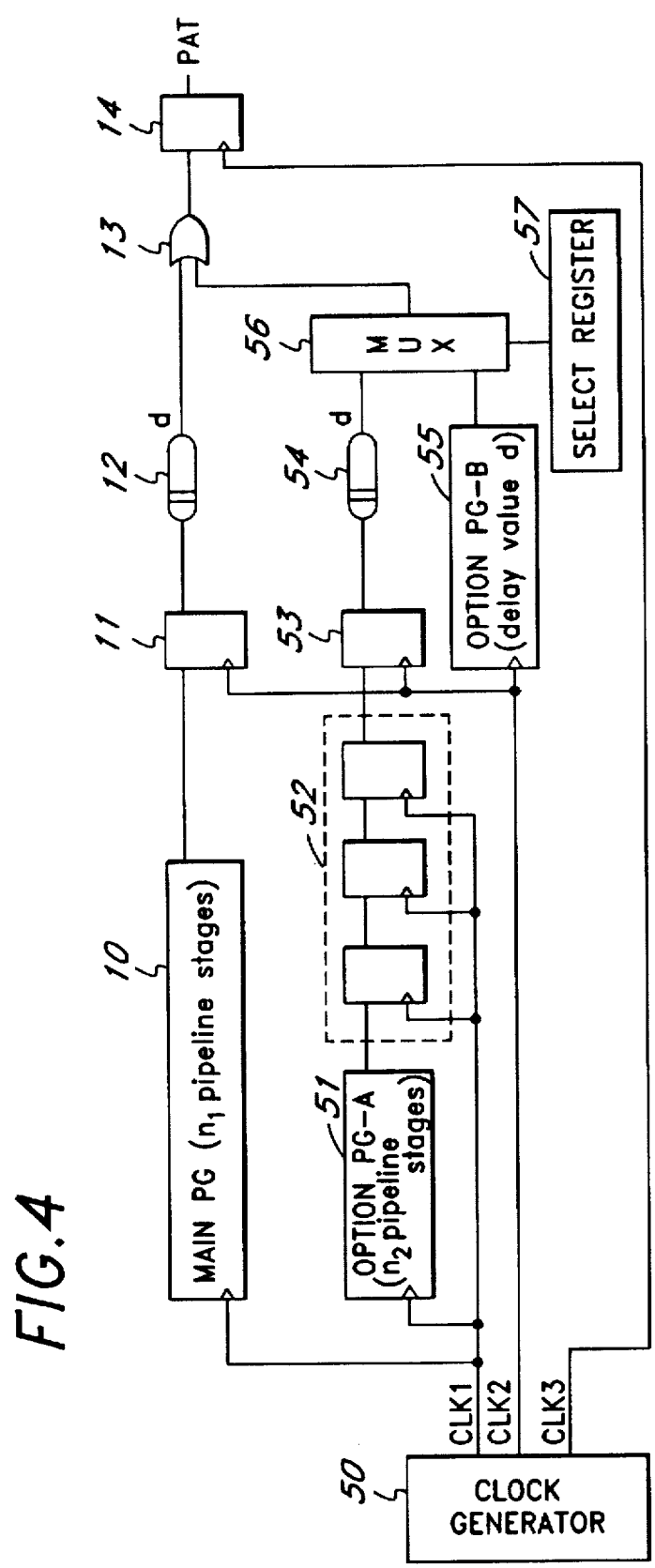
FIG. 4 is a block diagram of a conventional pattern generator.
Figure 5:
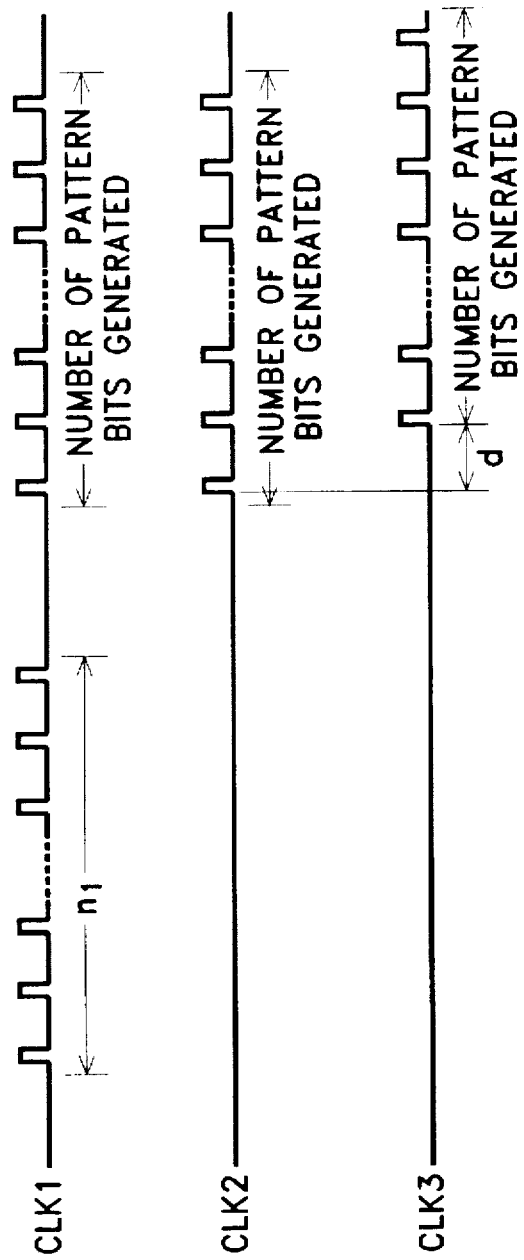
FIG. 5 is an example of a timing diagram for a conventional pattern generator.

First, pattern generation by PG 10 will be described. As shown by CLK1, CLK2, and CLK3 in the timing diagram of FIG. 3, to initialize PG 10, which has $n_1$ pipeline stages, the pipeline is filled with $n_1$ CLK1 clocks. Pattern data clocked out of main PG 10 by subsequent CLK1 clocks is clocked into register 11 by CLK2. The output of register 11 is clocked through delay circuit A (12) and logic circuit 13 into register 14 by CLK3, which is delayed by d amount with respect to CLK2, all of which ends up generating a pattern signal (PAT) consisting of p1 bits.

Next, pattern generation by an option PG will be explained, using the operation of option PG-A (27), which has $n_2$ pipeline stages, as an example. First (as shown in FIG. 2), a value for $n_2$, the number of pipeline stages, is written into initial clock register 41 in option PG initial clock control section 21 by WCMD1, and a value that will provide a divided clock frequency at which option PG-A (27) is capable of operating, is written into clock division ratio register 42 by WCMD2. Then, after the data contained in initial clock register 41 ($n_2$) has been loaded into counter 44 by the LOADCMD signal, clock 4 is generated, causing the count in counter 44 to be counted down by the divided clock divided by clock divider circuit 43. Counter ≠0 detector circuit 45 outputs a "1" until $n_2$ divided clocks have been generated. The end result is the generation of an INITCLK signal having $n_2$ clocks.

At this time, select register 24 (FIG. 1) selects the CLKA output of clock output control section 26 to generate $n_2$ CLKA clocks. Select register 24 also selects the WCLKA and DATAA for output from multiplexer 30, applying $n_2$ of each to the WCLK and WDT inputs of FIFO section 31. In addition, $n_2$ INITCLK clocks are delayed by delay circuit D (35), and fed to the RCLK input of FIFO section 31. Through the above operation, option PG-A (27), having $n_2$ pipeline stages, is initialized by filling the pipeline with $n_2$ CLKA clocks. The CLKA clocks that follow, will clock out DATAA as the option PG-A (27) output, which will become the first data of the desired pattern. Option PG-A (27) and FIFO section 31 have now been initialized.

Each time the option PG selection changes, initial clock register 41 (in option PG initial clock control section 21) and clock division ratio register 42 are set to values that match the new selection.

The pattern data output from option PG-A (27) is controlled by an enable signal from main PG 10. This enable signal is first delayed to put it in phase with CLK2 (FIG. 3), then input to option PG clock control section 22 [as enable signal B]. During the time enable signal B is applied to it, option PG clock control section 22 outputs p2 clocks of a CLK2-synchronous clock signal, where p2 is the number of option PG pattern bits generated.

Clock output control section 26 outputs only the selected clock, so that only the option PG selected by select register 24 will operate. In this example, since option PG-A is selected, p2 clocks of only the CLKA signal are output. CLKA causes option PG-A (27) to operate, outputting pattern data (DATAA) along with WCLKA clocks. The pattern data is written into FIFO section 31. The enable signal is delayed in delay circuit B (33) to put it in phase with CLK2, further delayed in delay circuit C (34) to put it in phase with CLK5 (which is output synchronous with CLK3), and input to RCLK control section 23. During the time enable signal C is being input to RCLK control section 23, exactly p2 clocks of a CLK5-synchronous clock signal are output (where p2 is the number of option PG pattern bits generated). This clock signal is input to FIFO section 31 to clock out pattern data that was written into the FIFO by the WCLK signal. This pattern data is input to logic circuit 13, where it is ORed and fed into register 14 per CLK3 timing for output as the PAT (pattern) signal.

An option PG and FIFO section 31 having the desired number of pipeline stages, then, can be initialized by the INITCLK initial clock signal generated by option PG initial clock control circuit 21. In addition, for option PG having no pipeline configured for delay operation with a delay time within a range determined by d, the delay time can be absorbed by FIFO section 31.

Additionally, within a range determined by p1, the number of pattern bits generated by main PG 10, the number of pattern bits generated by the option PG can be controlled by an enable signal generated by main PG 10.

In the above embodiment, a clock output control section 26 is provided. In this clock output control section 26, only the selected clock signals are output, so that only the option PG selected by select register 24 will operate.

This clock output control section 26 may be eliminated, however, to provide a simpler clock distribution section. When this is done, only the selected PG output, as selected in multiplexer 30 by selector 24, can be output.

A multiplexer 30 is provided in each of the above embodiments so that the output from one of a plurality of option PGs can be selected for output. For a single option PG, however, multiplexer 30 may be omitted.

Because the present invention is constituted as described above, the following described results are realized.

An option PG and FIFO 31 can be initialized to have the desired number of pipeline stages by an INITCLK signal generated by option PG initial clock control section 21.

In addition, for an option PG with no pipeline, operating in delayed operation, within a range determined by delay time d, the delay time can be absorbed by FIFO section 31.

In addition, within a range determined by p1, where p1 is the number of pattern bits generated by main PG 10, the number of pattern bits generated by the option PG can be controlled by an enable signal generated by main PG 10.

Because of this, the freedom of design of the option PG is enhanced, and benefits will be realized in that, as long as the number of pattern bits generated and the delay do not exceed the values set for the main PG, the need for redesign in order to connect an option PG will be eliminated.

What is claimed is:

1. A pattern generator circuit for a semiconductor test system, comprising:

a clock generator (20), which generates a first clock (CLK1), a second clock (CLK2), and a third clock (CLK3);

a main PG (10) having $n_1$ pipeline stages, which is clocked by CLK1;

a first register (11), into which an output of said main PG (10) is clocked by CLK2;

a delay circuit A (12), which delays an output signal of said first register (11);

a first logic circuit (13), which takes the logical OR of an output of said delay circuit A (12) and the output of an option PG;

a second register (14), which has an output of said first logic circuit (13) clocked into it by CLK3, and generates a PAT signal;

an option PG initial clock control section (21) that generates an initial clock signal (INITCLK) that is synchronous with a fourth clock (CLK4) from said clock generator (20), and initializes said option PG and a FIFO (first in first out) section (31);

an option PG clock control section (22) that inputs an enable signal generated by said main PG (10), and generates a clock output signal that is synchronous with CLK2;

a read clock (RCLK) control section (23) that inputs an enable signal generated by said main PG (10) and generates a clock output signal that is synchronous with a fifth clock (CLK5) output from said clock generator (20) synchronous with CLK3;

an option PG (27) that inputs a signal obtained by taking, in a second logic circuit (25), the logical OR of a clock output signal of said option PG clock control section (22) and said INITCLK signal of option PG initial clock control section (21), and outputs pattern data and clock signals; and a FIFO section (31), that receives outputs of said option PG (27) as its write data (WDT) and write clock (WCLK) inputs, and, in a third logic circuit (32), takes the logical OR of said INITCLK output signal of said option PG initial clock control section (21) that has been delayed in a delay circuit D (35) and an output of said RCLK control section (23), and inputs the resulting output as its read clock (RCLK), and outputs a signal to said first logic circuit (13) as an option PG output signal.

2. A pattern generator circuit for a semiconductor test system as defined in claim 1, wherein said option PG is configured as a plurality of option PGs (27, 28, 29) that input a signal obtained by taking the logical OR, in said second logic circuit (25), of a clock output signal of said option PG clock control section (22) and said INITCLK signal of said option PG initial clock control section (21), and comprises a multiplexer (30) that selects, through operation of a select register (24), outputs from one of said plurality of option PGs (27, 28, 29) for output to said FIFO (31).

3. A pattern generator circuit for a semiconductor test system, comprising:

a clock generator (20), which generates a first clock (CLK1), a second clock (CLK2), and a third clock (CLK3);

a main PG (10) having $n_1$, pipeline stages, which is clocked by CLK1;

a first register (11), into which an output of said main PG (10) is clocked by CLK2;

a delay circuit A (12), which delays an output signal of said first register (11);

a first logic circuit (13), which takes the logical OR of an output of said delay circuit A (12) and the output of an option PG;

a second register (14), which has an output of said first logic circuit (13) clocked into it by CLK3, and generates a PAT signal;

an option PG initial clock control section (21) that generates an initial clock signal (INITCLK) that is synchronous with a fourth clock (CLK4) from said clock generator (20), and initializes said option PG and a FIFO (first in first out) section (31);

an option PG clock control section (22) that inputs an enable signal generated by said main PG (10) and delayed by a delay circuit B (33), and generates a clock output signal that is synchronous with CLK2;

a read clock (RCLK) control section (23) that inputs an enable signal generated by said main PG (10) and delayed by said delay circuit B (33) and a delay circuit C (34), and generates a clock output signal that is synchronous with a fifth clock (CLK5) output from said clock generator (20) synchronous with CLK3;

a clock output control section (26) that inputs a signal obtained by taking, in a second logic circuit (25), the logical OR of a clock output signal of said option PG clock control section (22) and said INITCLK signal of said option PG initial clock control section (21), and selects as its output, through the operation of a select register (24), one of a plurality of clock outputs;

a plurality of option PGs (27, 28, 29), each of which takes one signal of a plurality of clock output signals output by a clock output control section (26) as its input, and outputs pattern data and clock signals; and a FIFO section (31) that selects, in a multiplexer 30, through the operation of said select register (24), output signals of one of said plurality of option PGs for input as its write data (WDT) and write clock (WCLK) inputs, and in a third logic circuit (32), takes the logical OR of said INITCLK output signal of said option PG initial clock control section (21) and an output of said RCLK control section (23), and inputs the resulting output as its read clock (RCLK), and outputs a signal to said first logic circuit (13) as an option PG output signal.

4. A pattern generator circuit for a semiconductor test system as defined in claim 1, wherein said option PG initial clock control section (21) comprising:

an initial clock register (41) that can be set to a desired number of pipeline stages to initialize said option PG;

a clock division ratio register (42) that sets a division ratio for the division of said fourth clock (CLK4) such that the frequency of said initial clock (INITCLK) will match a frequency at which said option PG can operate;

a clock divider circuit (43) that, with CLK4 as its input, generates a divided clock output in accordance with said division ratio setting of said clock division ratio register 42;

a counter (44), which has the contents of said initial clock register (41) loaded into it by the LOADCMD signal, and is counted by the divided clock signal, which is the output of said clock divider circuit (43); and a counter ≠0 detector circuit (45), which detects the fact that the output of said counter (44) has become zero, to control the output of the divided clock signal, which is the output of said clock divider circuit 43, as the INITCLK signal.

5. A pattern generator circuit for a semiconductor test system as defined in claim 3, wherein said option PG initial clock control section (21) comprising:

an initial clock register (41) that can be set to a desired number of pipeline stages to initialize said option PG;

a clock division ratio register (42) that sets a division ratio for the division of said fourth clock (CLK4) such that the frequency of said initial clock (INITCLK) will match a frequency at which said option PG can operate;

a clock divider circuit (43) that, with CLK4 as its input, generates a divided clock output in accordance with said division ratio setting of said clock division ratio register 42;

a counter (44), which has the contents of said initial clock register (41) loaded into it by the LOADCMD signal, and is counted by the divided clock signal, which is the output of said clock divider circuit (43); and a counter ≠0 detector circuit (45), which detects the fact that the output of said counter (44) has become zero, to control the output of the divided clock signal, which is the output of said clock divider circuit 43, as the INITCLK signal.

* * * * *